United States Patent [19]

Brahms et al.

[11] Patent Number: 5,039,887

[45] Date of Patent: Aug. 13, 1991

[54] CIRCUIT ARRANGEMENT FOR CONTROLLING THE LEVEL OF ELECTRICAL SIGNALS

[75] Inventors: Martin Brahms, Hanover; Andreas Hennig, Garbsen; Andreas Timmermann, Ronnenberg, all of Fed. Rep. of Germany

[73] Assignee: KE Kommunikations Elektronik, Hanover, Fed. Rep. of Germany

[21] Appl. No.: 575,406

[22] Filed: Aug. 29, 1990

[30] Foreign Application Priority Data

Aug. 31, 1989 [DE] Fed. Rep. of Germany ....... 3928775

[51] Int. Cl.$^5$ .................. G06G 7/12; H03K 5/153; H03K 17/687; H03L 5/00
[52] U.S. Cl. .................................. 307/490; 307/491; 307/494; 307/497; 307/359; 307/264; 307/572
[58] Field of Search ............... 307/490, 491, 494, 497, 307/359, 264, 571, 572, 272.2

[56] References Cited

U.S. PATENT DOCUMENTS

| | | | |
|---|---|---|---|
| 4,258,275 | 3/1981 | Ebihara | 307/571 |
| 4,763,028 | 8/1988 | Henry | 307/572 |
| 4,883,987 | 11/1989 | Fattaruso | 307/491 |

Primary Examiner—Stanley D. Miller
Assistant Examiner—Trong Phan
Attorney, Agent, or Firm—Peter C. Van Der Sluys

[57] ABSTRACT

For controlling the level of electrical signals a circuit arrangement is formed with two series connected amplifiers. A first amplifier containing a first variable resistor, operates at maximum amplification when a low input signal level is received. A second amplifier comprises a series connection of a second variable resistor and a current-controlled voltage source with two complementary outputs. The outputs of the voltage source are connected to a comparator and a controller with two separate outputs. One of the controller outputs transmits a control signal while the other output simultaneously transmits a blocking signal. A first output of the controller is connected with the first variable resistor, while a second output of the controller is connected to the second variable resistor.

11 Claims, 1 Drawing Sheet

CIRCUIT ARRANGEMENT FOR CONTROLLING THE LEVEL OF ELECTRICAL SIGNALS

BACKGROUND OF THE INVENTION

1. Field of the Invention

The present invention relates to a circuit arrangement for controlling the level of electrical signals, and more particularly to a circuit wherein the signals are controlled to a constant level.

2. Description of the Prior Art

A circuit arrangement of this type is present, in principle, in conventional control amplifiers. The term 'amplifier' is used generically and covers devices that can both increase and decrease current as required by the control. For the sake of simplicity, 'amplifier' will be used in the following text instead of the term 'circuit arrangement'.

The use of an amplifier in the transmission of analog and digital signals is unproblematic if a continuous signal transmission is present. An excessively high input signal can be processed, for example, by an overmodulation of the amplifier. Problems occur, however, in so-called 'burst operation' in which signal bursts between large spaces are to be processed. A non-continuous signal transmission of this type is present, for example, in the bidirectional transmission of signals in a burst operation. Satisfactory processing of such signals is not possible with the amplifiers of the prior art. In the prior art, the signals are distorted, because the bandwidth and the dynamic range of the known amplifiers are not sufficient to convert the bursts arriving at large intervals into an output signal with a constant level. This defect of the known amplifiers can lead to the fact that no useful signal is available at the output. In that case, the signal transmission is not possible overall.

SUMMARY OF THE INVENTION

An object of the present invention is to provide a circuit arrangement by means of which the level of electrical signals can be controlled in a distortion-free manner over a broad frequency range, even in the case of greatly different levels.

This object is achieved with a circuit arrangement formed of two series connected amplifiers. A first amplifier containing a first variable resistor operates at maximum amplification when a low input signal level is received. A second amplifier comprises a series connection of a second variable resistor and a current-controlled voltage source with two complementary outputs. The outputs of the voltage source are connected to a comparator and a controller with two separate outputs. One of the controller outputs transmits a control signal while the other output simultaneously transmits a blocking signal. A first output of the controller is connected with the first variable resistor, while a second output of the controller is connected to the second variable resistor.

The circuit arrangement constructed in this manner operates with low noise, because, in a critical region when a low level input signal is received, maximum amplification is always produced by the first amplifier. It also guarantees a broadband manner of operation with a large dynamic range. Overall, distortion-free processing of the input signals is ensured. All of this is achieved essentially through the series connection of the two amplifiers, both of which in turn are adjusted by the controller.

A weak input signal is first amplified by the first amplifier with maximum amplification. If the amplification is not sufficient, further control of the signal level is taken over by the second amplifier. In the case of a strong signal at the input, which must be adjusted downwardly by the circuit arrangement, the sequence is the reverse.

By means of this well-defined assignment of the level regions to the first amplifier on the one hand and to the second amplifier on the other hand, it is ensured that, for one thing, the input stage receives maximum amplification in the case of a low-input level (good noise behavior) and, for another thing, that an excessively high input level is reduced (resistance to overload).

DETAILED DESCRIPTION OF THE INVENTION

Figure 1:
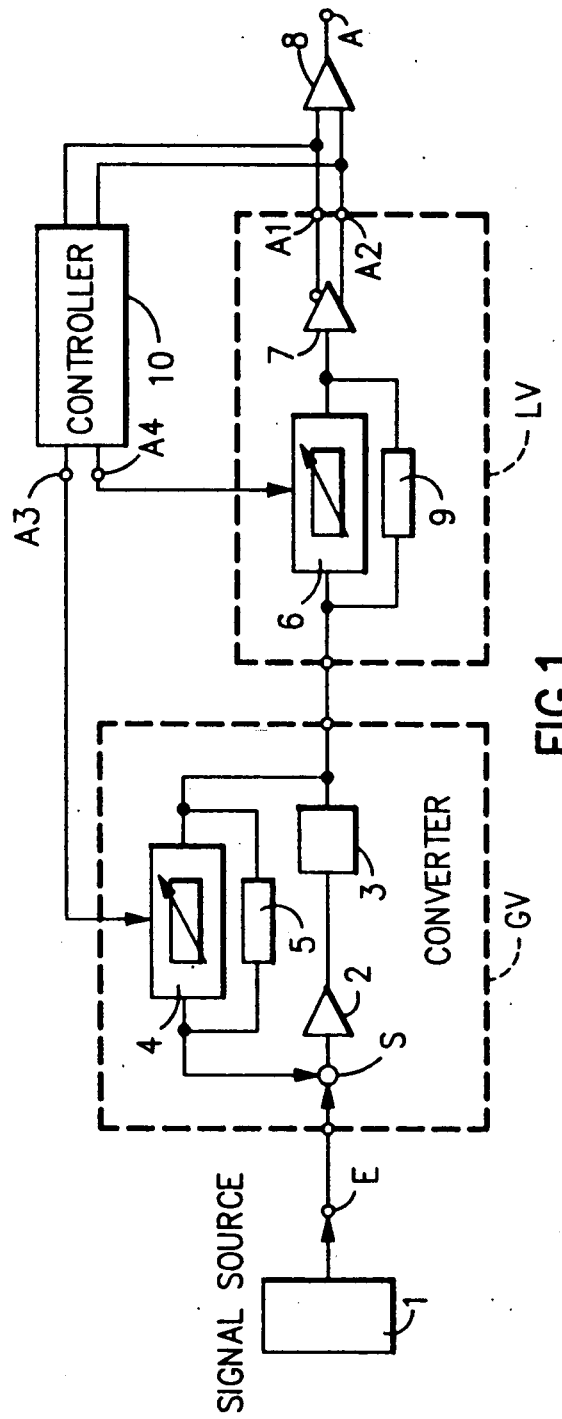
FIG. 1 is a block diagram of the circuit arrangement according to the invention.

The circuit arrangement according to FIG. 1 operates, for example, in the following manner:

An electrical signal applied by a signal source 1 to an input E is conducted through a summation point S to a current amplifier 2. The output current of the current amplifier 2 is converted to an inversely proportional voltage in a converter 3. This voltage is conducted through a variable resistor 4 back to the summation point S. In parallel with the variable resistor 4 there is located an ohmic resistor 5. Both resistors 4 and 5, together, form a feedback network. The current amplifier 2 thus amplifies a current that is applied to the summation point S as the difference of the currents coming from the signal source 1 on the one hand and from the variable resistor 4 on the other hand. The parts 2, 3, 4 and 5 represent a first negative feedback amplifier GV enclosed by a dashed/dotted line, in which the feedback factor is adjustable over a broad range greater than 40 dB.

In series with the first amplifier GV there is located a second amplifier LV, also surrounded by a dashed/dotted line. The amplifier LV includes a second variable resistor 6 and a current-controlled voltage source 7, located in series with said variable resistor. Voltage source 7 has two complementary outputs A1 and A2. The two outputs A1 and A2 of the voltage source 7 are connected to a comparator 8, which digitalizes the applied signal by means of amplitude decision and makes it available as a digital signal at the output A. In parallel with the variable resistor 6 there is located an ohmic resistor 9.

The output signal of the voltage source 7 is symmetrically picked off at the outputs A1 and A2 and is supplied to a controller 10, which has two outputs A3 and A4, which are inverse in a preferred embodiment. Voltages of identical magnitude but opposite sign are then available at these outputs. The variable resistor 4 is acted on via the output A3, while the output A4 controls the variable resistor 6.

The outputs A3 and A4 of the controller 10 need not be of inverse design. It must only be ensured that the one output supplies a blocking signal, so that the connected resistor is not affected when the other output transmits a controlling signal. This can be achieved, for example, by the fact that the output from which a blocking signal is transmitted is grounded.

Let us assume that the signal source 1 supplies a strong signal, which leads to an excessively high level at the outputs A1 and A2 of the voltage source 7. The excessively high output signal of the voltage source 7 is supplied to the controller 10, which can be, for example, an integral controller, and which adjusts the variable resistor 6 via its output A4. The, for example, positive voltage at the output A4 is reduced by the controller 10 for this purpose, so that the resistance value of the resistor 6 is increased. At the same time, the voltage at the output A3 remains negative or grounded, so that a blocking signal is transmitted from this output and the resistor 4 is not adjusted. Overall, the level at the outputs A1 and A2 of the voltage source 7 is reduced as a result.

The reduction of this output level by the resistor 6 is limited by the parallel resistor 9, so that the high-spectral components of the signal are not primarily transmitted via unavoidable series capacitances. This would result in signal distortions. As a result of the dynamic limitation by means of the resistor 9, the desired decrease in the level at the outputs A1 and A2 cannot be achieved, under some conditions, by means of the variable resistor 6 alone.

Simultaneously with the reduction of the positive voltage at the output A4 of the controller 10 (in the case of inverse outputs A3 and A4), the negative voltage at its output A3 is reduced in magnitude. However, this is not initially sufficient to adjust the variable resistor 4. Only when the voltage at the output A3 becomes positive does this lead to an adjustment of the resistor 4. The negative voltage of the output A4 of the controller 10 maintains the resistor 6 at the adjusted value, as a blocking signal.

If, therefore, a reduction of the level at the outputs A1 and A2 of the voltage source 7 is no longer possible with the resistor 6, but this level is still too high, then the further downward adjustment is carried out by means of the variable resistor 4. With increasing positive voltage at the output A3 of the controller 10, the resistance value of the variable resistor 4 is reduced, so that the difference in the currents at the summation point S becomes smaller (the effective negative feedback is then increased). The current amplifier 2 is therefore supplied with such a greatly reduced current that the desired stable level is present at the outputs A1 and A2 of the voltage source 7.

If only a weak signal is supplied by the signal source 1, the following happens:

The variable resistor 4 is first increased in value by a decreasing positive voltage at the output A3 of the controller 10. The maximum value of the feedback network 4/5 is limited by the resistor 5. In order to be able to increase the total amplification further, the control voltage at the output A3 of the controller 10 is reduced (A4 is correspondingly increased) until the variable resistor 6 has declined to a value from which the desired level is obtained at the outputs A1 and A2 of the voltage source 7.

Figure 2:
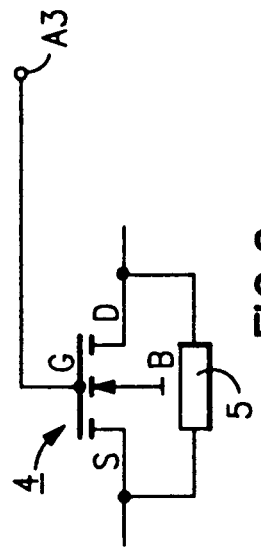
FIG. 2 is a schematic diagram of a subcomponent of FIG. 1.

The variable resistors 4 and 6 are not linear components. They are shown in FIG. 1 in a simplified manner as variable resistors. In a preferred embodiment, the resistors 4 and 6 are designed as field-effect transistors with their gate electrodes connected respectively to the two outputs A3 and A4 of the controller 10. In FIG. 2, a field-effect transistor of this type is shown as a variable resistor 4. This involves a symmetrically constructed D-MOSFET, whose gate electrode G is connected to the output A3 of the controller 10. The resistor 5, connected in parallel, is connected to the electrode's source S and drain D. The substrate electrode B is grounded. An identical arrangement can be used for the resistor 6.

The current-controlled voltage source 7 is, for example, a transimpedance amplifier with two symmetrical outputs A1 and A2 (push-pull outputs).

What is claimed is:

1. A circuit arrangement for controlling the level of electrical signals applied to an input, said arrangement comprising:
    a first amplifier connected to the input and including a first variable resistor, said first amplifier operating with maximum amplification at a low level of the signal applied to the input;
    a second amplifier connected in series with the first amplifier and including a second variable resistor and a current-controlled voltage source with two complementary outputs;
    a comparator connected to the outputs of the voltage source; and
    a controller connected to the outputs of the voltage source, said controller having two separate outputs, one of which transmits a controlling signal while the other simultaneously transmits a blocking signal, a first output of the controller being connected to the first variable resistor and a second output of the controller being connected to the second variable resistor.

2. A circuit arrangement according to claim 1, additionally comprising an ohmic resistor connected in parallel with each of said variable resistors.

3. A circuit arrangement according to claim 1, wherein the variable resistors are field-effect transistors each having a control electrode connected to one of the outputs of the controller.

4. A circuit arrangement according to claim 1, wherein the current-controlled voltage source comprises a transimpedance amplifier.

5. A circuit arrangement according to claim 1, wherein the controller outputs provide voltage values of equal magnitude but opposite phase.

6. A circuit arrangement according to claim 2, wherein the variable resistors are field-effect transistors each having a control electrode connected to one of the outputs of the controller.

7. A circuit arrangement according to claim 2, wherein the current-controlled voltage source comprises a transimpedance amplifier.

8. A circuit arrangement according to claim 3, wherein the current-controlled voltage source comprises a transimpedance amplifier.

9. A circuit arrangement according to claim 2, wherein the controller outputs provide voltage values of equal magnitude but opposite phase.

10. A circuit arrangement according to claim 3, wherein the controller outputs provide voltage values of equal magnitude but opposite phase.

11. A circuit arrangement according to claim 4, wherein the controller outputs provide voltage values of equal magnitude but opposite phase.

* * * * *